(12) United States Patent  
Yamanoue et al.

(10) Patent No.: US 7,211,897 B2  
(45) Date of Patent: May 1, 2007

(54) SEMICONDUCTOR DEVICE AND METHOD FOR FABRICATING THE SAME

(75) Inventors: Akira Yamanoue, Kawasaki (JP); Tsutomu Hosoda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/694,766

(22) Filed: Oct. 29, 2003

(65) Prior Publication Data

US 2004/0084777 A1    May 6, 2004

(30) Foreign Application Priority Data

Oct. 30, 2002    (JP)    ............................. 2002-316605

(51) Int. Cl.  
*H01L 23/48*    (2006.01)  
*H01L 23/52*    (2006.01)  
*H01L 29/40*    (2006.01)

(52) U.S. Cl. ...................... 257/758; 257/762; 257/773; 257/774; 257/786; 257/E23.02

(58) Field of Classification Search ................ 257/758, 257/762, 773, 774, 786, 7  
See application file for complete search history.

(56) References Cited

U.S. PATENT DOCUMENTS

| | | | | |
|---|---|---|---|---|
| 6,225,697 B1* | 5/2001 | Iguchi | .................. | 257/758 |
| 6,452,274 B1* | 9/2002 | Hasegawa et al. | .......... | 257/758 |
| 6,559,548 B1* | 5/2003 | Matsunaga et al. | ......... | 257/774 |

| | | | | |
|---|---|---|---|---|
| 2002/0040986 A1 | 4/2002 | Sugiyama et al. | | |
| 2002/0052125 A1* | 5/2002 | Shaffer et al. | .............. | 438/780 |

FOREIGN PATENT DOCUMENTS

| | | |
|---|---|---|
| JP | 2000-232081 | 8/2000 |
| JP | 2000-232104 | 8/2000 |
| JP | 2000-232105 | 8/2000 |
| JP | 2000-277465 | 10/2000 |
| JP | 2000-277713 | 10/2000 |
| JP | 2001-53148 | 2/2001 |
| JP | 2001-168093 | 6/2001 |

OTHER PUBLICATIONS

Chinese Office Action dated Jan. 6, 2006.

* cited by examiner

*Primary Examiner*—Nitin Parekh  
(74) *Attorney, Agent, or Firm*—Westerman, Hattori, Daniels & Adrian, LLP.

(57) ABSTRACT

The semiconductor device comprises on a semiconductor substrate an insulating structure formed of a plurality of insulating films; an interconnection structure buried in the insulating structure and formed of a plurality of conducting layers; and a plurality of dummy patterns formed of the same conducting layer as the conducting layers forming the interconnection structure and buried in a surface side of the respective insulating films, and the dummy patterns near the interconnection structure are connected with each other through via portions. Thus, the insulating structure near the interconnection structure are reinforced, and the generation of cracks and peelings in the interfaces between the insulating films or in the inter-layer insulating films due to mechanical stresses or thermal stresses can be prevented.

9 Claims, 11 Drawing Sheets

SEMICONDUCTOR DEVICE AND METHOD FOR FABRICATING THE SAME

CROSS-REFERENCE TO RELATED APPLICATIONS

This application is based upon and claims the benefit of priority from the prior Japanese Patent Application No. 2002-316605, filed on Oct. 30, 2002, the entire contents of which are incorporated herein by reference.

BACKGROUND OF THE INVENTION

The present invention relates to a semiconductor device and a method for fabricating the same, more specifically, a semiconductor device including an inter-layer insulating film of a low dielectric constant material and a method for fabricating the semiconductor device.

In semiconductor device fabrication processes, a number of elements are formed on one semiconductor wafer, and the semiconductor wafer is cut along dicing lines into discrete LSI chips. On the side walls along the dicing lines, the interfaces of many inter-layer insulating films laid in the process of forming the elements are exposed. The interfaces are often paths for water intrusion, causing problems, such as erroneous operations and breakages, etc. of semiconductor devices, which impair their reliability. Stresses in the dicing, and stresses, etc. due to thermal expansion coefficient differences between the inter-layer insulating films and a sealing resin cause cracks in the inter-layer insulating films, and the cracks often are paths for water intrusion.

A structure bounding each LSI chip is provided inside the dicing lines along all the border, whereby the intrusion of water through the interfaces of the inter-layer insulating films and the extension of cracks in the inter-layer insulating films into the chip are prevented. Such structure is formed of layers of dummy patterns which are formed of the same layers as the interconnection layers forming the internal circuits and is often called a guard ring, a seal ring, a moisture resistant ring or others. Structures for preventing the water intrusion and cracks are described in, e.g., Japanese published unexamined patent application No. 2000-232081, Japanese published unexamined patent application No. 2000-232104, Japanese published unexamined patent application No. 2000-232105, Japanese published unexamined patent application No. 2000-277465, Japanese published unexamined patent application No. 2000-277713, Japanese published unexamined patent application No. 2001-053148, Japanese published unexamined patent application No. 2001-168093, and Japanese published unexamined patent application No. 2002-134506.

On the other hand, as semiconductor devices are larger scaled and more highly integrated, the design rules for the interconnection have been diminished as the generations have passed. Conventionally, the interconnection layers have been formed by depositing conducting materials and patterning the deposited conducting materials by lithography and dry etching, but as the generation passes, it has technical limits. As a new forming process which takes the place of the conventional interconnection layer forming process, the so-called damascene process, in which groove patterns and hole patterns are formed in inter-layer insulating films, and conducting materials are buried in the grooves and the holes, is increasingly used. The damascene process can form interconnection layers of low resistance materials, such as copper which is difficult for reactive etching, and is very effective to form low-resistance interconnection layers having micronized patterns.

As the interconnection layers are more micronized, the spacings of interconnections are smaller. Increase of the parasitic capacitance formed via the inter-layer insulating films is one factor for hindering speed-up of semiconductor devices. The use of organic insulating materials having lower dielectric constants (low-kmaterials) than the conventionally used silicon oxide film and silicon nitride film are studied. As the organic insulating materials, an organic-based polymer called "SiLK" (registered trademark) from The Dow Chemical Company, which is an organic SOG material, an organic-based polymer called "FLARE" (registered trade mark) from Honeywell Electronic Materials, etc. are known.

Low dielectric constant materials, such as the above-described organic insulating materials, etc. are largely different from the conventional materials having siloxane bonds, which are based on silicon oxide film in physical properties, such as Young's modulus, hardness and thermal expansion coefficient. Generally, to obtain low dielectric constant, structures, as of atoms or molecules, inside materials must be changed. The dielectric constant can be lowered as inter-atom distances or inter-molecule distances are larger, but increase of inter-atom distances or inter-molecule distances lead to lower bond strength. Accordingly, when a multi-level interconnection structure is formed of low dielectric constant materials, the adhesion in the interfaces with the inter-layer insulating films is lowered in comparison with the adhesion in the interfaces with the inter-layer insulating films of insulating materials based on the conventional silicon oxide film having siloxane bonds, and the mechanical strength of the inter-layer insulating films themselves is also lowered.

Accordingly, it has been found that the semiconductor device having the inter-layer insulating films formed of low dielectric constant materials have lower mechanical strength in comparison with the semiconductor device including the conventional insulating materials and has cracks and peelings due to even the mechanical stresses which have been insignificant in the fabrication process of the conventional structures.

In dual damascene process, for example, in the CMP (Chemical Mechanical Polishing) for planarizing inter-layer insulating films and filling copper interconnection layers, cracks and peelings have been often caused due to mechanical stresses applied to the interfaces between the inter-layer insulating films and inside the inter-layer insulating films.

On the guard rings, the inductors, etc., which are structures of stacked acutely bent interconnections, thermal stresses during processing and stresses from packages after mounted tend to be concentrated, often causing cracks from parts near the pattern corners to the inter-layer insulating films.

Due to wire bonding and formation of bumps, stresses are concentrated on the interconnection materials of pads, and the mechanical stresses often cause cracks in parts upper or lower of the pads.

In the fuse circuit regions of the redundant circuits, cracks are often caused due to thermal impulses of lasers when the metal fuses are cut by the lasers.

The cracks caused in the inter-layer insulating films do not impair device functions. However, the cracks are extended during use of devices, often causing serious problems in the reliability. To solve this problem, structures and fabrication methods which can effectively prevent the cracks and peelings in the semiconductor devices using low dielectric constant materials are expected.

SUMMARY OF THE INVENTION

An object of the present invention is to provide a semiconductor device including inter-layer insulating film of low dielectric constant material, which can effectively prevent cracks and peelings due to mechanical or thermal stresses in the interfaces between the inter-layer insulating films or in the inter-layer insulating films, and a method for fabricating the semiconductor device.

According to one aspect of the present invention, there is provided a semiconductor device comprising: a first insulating film formed over a semiconductor substrate; a second insulating film formed over the first insulating film; an interconnection structure buried in the first insulating film and in the second insulating film; a first dummy pattern of a first conducting layer buried in at least a surface side of the first insulating film near the interconnection structure; and a second dummy pattern formed of a second conducting layer buried in the second insulating film near the interconnection structure and connected to the first dummy pattern through a via portion.

According to another aspect of the present invention, there is provided a semiconductor device comprising: an insulating structure having a plurality of insulating films formed over a semiconductor substrate; an interconnection structure formed of a plurality of conducting layers buried in the insulating structure; and a plurality of dummy patterns formed of the same conducting layers as the conducting layers forming the interconnection structure and buried in at least a surface side of the respective insulating films, the dummy patterns near the interconnection structure being connected with each other through via portions.

According to further another aspect of the present invention, there is provided a method for fabricating a semiconductor device comprising the steps of: forming a first insulating film over a semiconductor substrate; burying in at least a surface side of the first insulating film a first interconnection pattern, and a first dummy pattern formed near the first interconnection pattern and formed of the same conducting layer as the first interconnection pattern; forming a second insulating film over the first insulating film with the first interconnection pattern and the first dummy pattern buried in; and burying in the second insulating film a second interconnection pattern connected to the first interconnection pattern through a via portion, and a second dummy pattern formed near the second interconnection pattern, formed of the same conducting layer as the second interconnection pattern and connected to the first dummy pattern through a via portion.

According to the present invention, near interconnection structures, such as guard rings, pads, inductors, etc., which may induce cracks and peelings in the interfaces between the inter-layer insulating films and in the inter-layer insulating films, dummy patterns of the same conducting layer forming the interconnection structures are provided, and the dummy patterns positioned thickness-wise are interconnected with each other through the via portions, whereby the inter-layer insulating films near the interconnected dummy patterns can be reinforced. Thus, the generation of cracks and peelings due to mechanical stresses or thermal stresses in the interfaces between the inter-layer insulating films and in the inter-layer insulating films can be prevented.

DETAILED DESCRIPTION OF THE INVENTION

A First Embodiment

The semiconductor device and the method for fabricating the same according to a first embodiment of the present invention will be explained with reference to FIGS. 1 to 9C.

Figure 1:
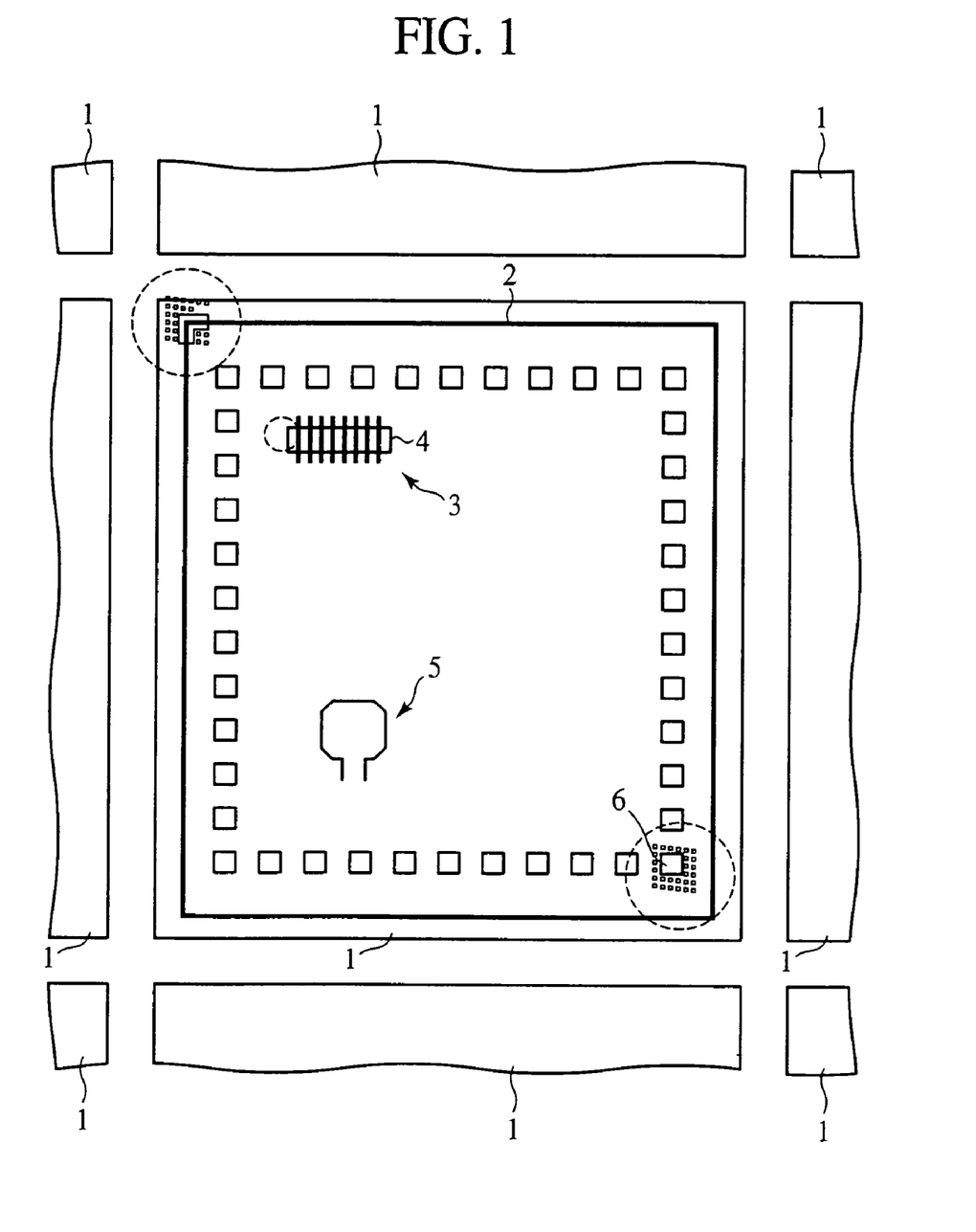
FIG. 1 is a plan view of interconnection structures formed on a semiconductor chip.
Figure 2:
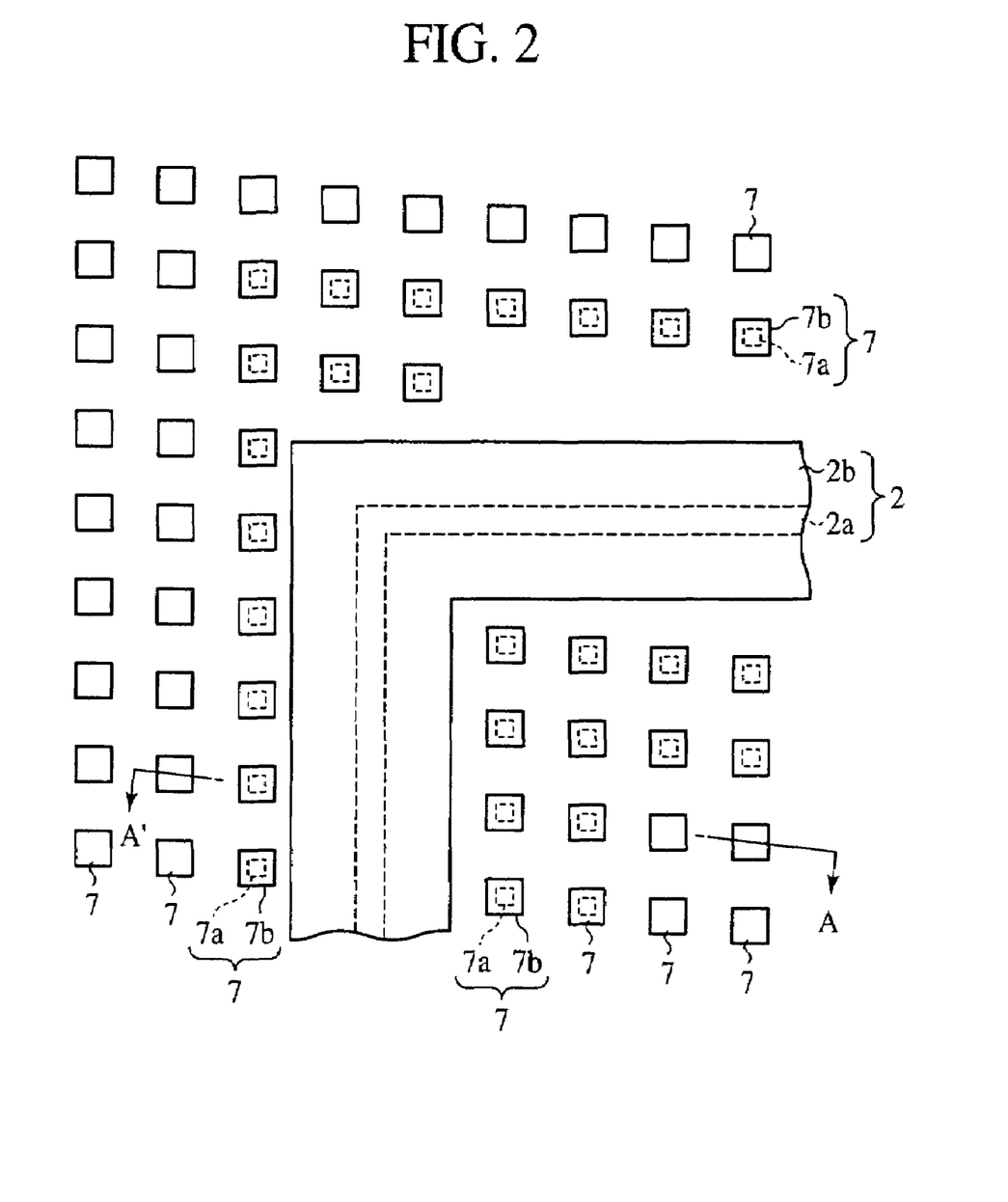
FIG. 2 is a plan view of the semiconductor device according to a first embodiment of the present invention, which shows a structure thereof.
Figure 3:
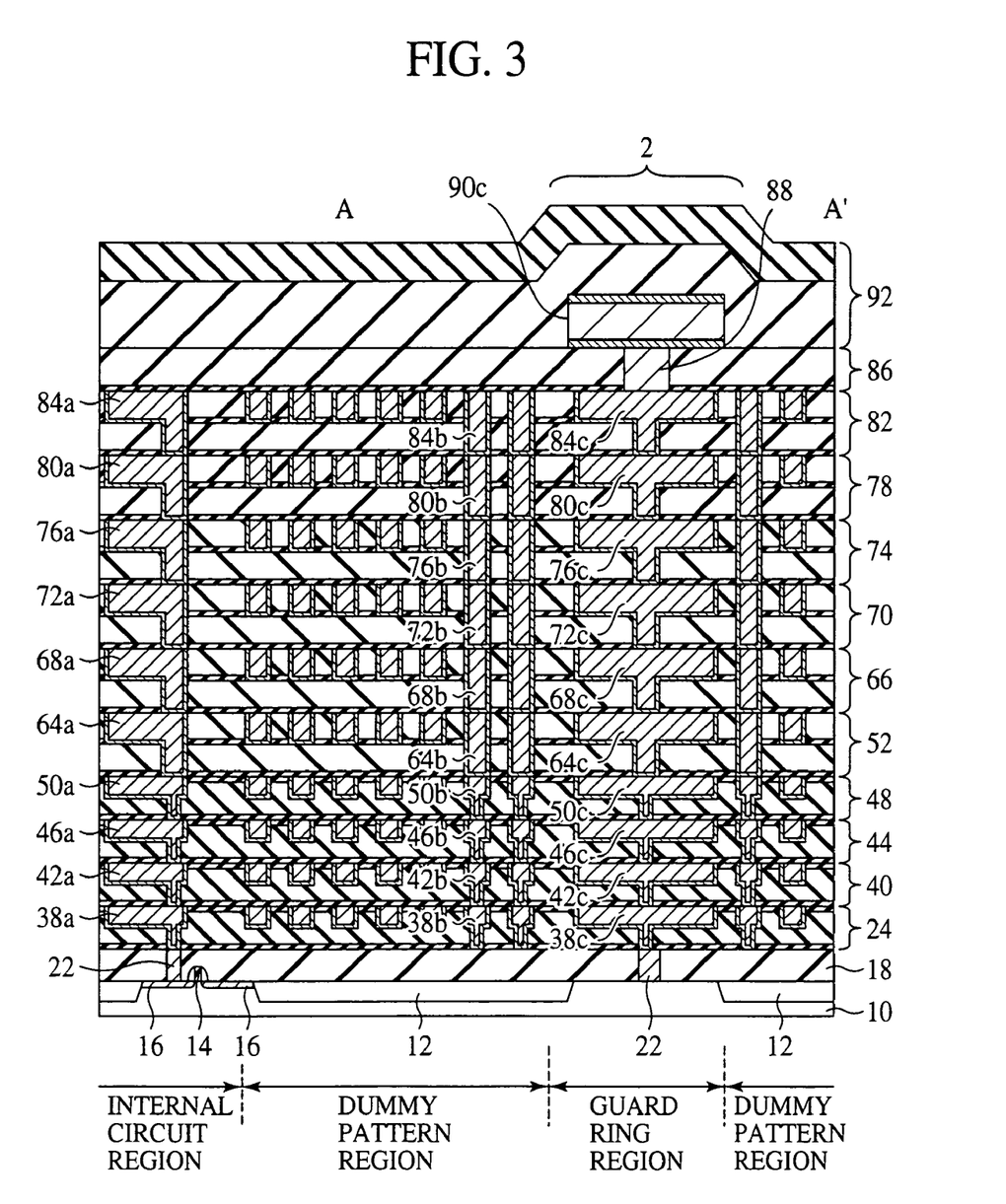
FIG. 3 is a diagrammatic sectional view of the semiconductor device according to the first embodiment of the present invention, which shows the structure thereof.

FIG. 1 is a plan view of interconnection structures formed on a semiconductor chip. FIG. 2 is a plan view of the semiconductor device according to the present embodiment, which shows a structure thereof. FIG. 3 is a diagrammatic sectional view of the semiconductor device according to the present embodiment, which shows the structure thereof. FIGS. 4A–9C are sectional views of the semiconductor device according to the present embodiment in the steps of the method for fabricating the same, which show the method.

First, the structure of the semiconductor device according to the present embodiment will be explained with reference to FIGS. 1 to 3.

Plural semiconductor chip regions 1 are provided on a semiconductor wafer. A guard ring 2 is provided at the periphery of each semiconductor chip regions 1, enclosing the internal circuit region of the semiconductor chip region 1. A fuse circuit region 3 for the redundant circuit is provided in the internal circuit region enclosed by the guard ring 2. A guard ring 4 is provided at the periphery of the fuse circuit region 3, enclosing the fuse circuit region 3. An inductor 5 is provided in the internal circuit region. Pads 6 for the electrical connection of the semiconductor chip with outside circuits are disposed at the periphery of the internal circuit region.

As described above, these structures formed on the semiconductor wafer are often causes for cracks and peelings in the interfaces between the inter-layer insulating films and in the inter-layer insulating films due to the mechanical stresses or the thermal stresses. In the present embodiment, a semiconductor device structure which can prevent the breakage of the inter-layer insulating films due to these structures will be explained by means of an example in which the present invention is applied to the structure near the guard ring disposed at the periphery of the semiconductor chip.

FIG. 2 is an enlarged plan view of the upper left corner of the semiconductor chip shown in FIG. 1.

As shown in FIG. 2, the guard ring 2 is formed of the layer structure of ring-shaped patterns each having a via portion 2a, and an interconnection portion 2b formed on the via portion 2a. The ring pattern is formed of the same conducting layers as the interconnection layers formed in the internal circuit region, and in this specification, for convenience, the constituent parts of the ring pattern are called the via portion and the interconnection portion (or the interconnection pattern).

Dummy patterns 7 are formed around the guard ring 2. The dummy patterns 7 are for decreasing intra-plane variations of a polishing amount, e.g., dishing due to overpolishing of copper or erosion due to overpolishing of the inter-layer insulating films in the CMP for forming the interconnection layers by dual damascene process. The dummy patterns 7 near the guard ring 2 each have a via portion 7a and an interconnection portion 7b.

FIG. 3 is a diagrammatic sectional view of the semiconductor device according to the present embodiment and is the sectional view along the line A–A' in FIG. 2.

As shown in FIG. 3, a device isolation film 12 is formed on a silicon substrate 10. On the silicon substrate 10 with the device isolation film 12 formed on, MOS transistors each including a gate electrode 14 and source/drain diffused layers 16 are formed. On the silicon substrate with the MOS transistors formed on, an inter-layer insulating film 18 with contact plugs 22 buried in is formed.

On the inter-layer insulating film 18, an inter-layer insulating film 24 of the layer structure of SiC film/SiLK film/SiC film is formed. In the inter-layer insulating film 24, interconnection layers 38a are buried in the internal circuit region, the dummy patterns 38b are buried in the dummy pattern regions, and a ring pattern 38c is buried in the guard ring region. The interconnection layers 38a, the dummy patterns 38b and the ring pattern 38c are formed of the same conducting layer. On the inter-layer insulating film 24, inter-layer insulating films 40, 44, 48 of the same layer structure as the inter-layer insulating film 24 are formed. In the inter-layer insulating film 40, as in the inter-layer insulating film 24, interconnection layers 42a, dummy patterns 42b and a ring pattern 42c are buried. In the inter-layer insulating film 44, as in the inter-layer insulating film 24, interconnection layers 46a, dummy patterns 46b and a ring pattern 46c are buried. In the inter-layer insulating film 48, as in the inter-layer insulating film 24, interconnection layers 50a, dummy patterns 50b and a ring pattern 50c are buried.

On the inter-layer insulating film 48, an inter-layer insulating film 52 of the layer structure of SiOC flm/SiC film/ SiOC film/SiC film is formed. In the inter-layer insulating film 52, as in the inter-layer insulating film 24, interconnection layers 64a, dummy patterns 64b and a ring pattern 64c are buried. On the inter-layer insulating film 52, inter-layer insulating films 66, 70, 74 of the same layer structure as the inter-layer insulating film 52 are formed. In the inter-layer insulating film 66, as in the inter-layer insulating film 24, interconnection layers 68a, dummy patterns 68b and a ring pattern 68c are buried. In the inter-layer insulating film 70, as in the inter-layer insulating film 24, interconnection layers 72a, dummy patterns 72b and a ring pattern 72c are buried. In the inter-layer insulating film 74, as in the inter-layer insulating film 24, interconnection layers 76a, dummy patterns 76b and a ring pattern 76c are buried.

On the inter-layer insulating film 74, an inter-layer insulating film 78 of the layer structure of $SiO_2$ film/SiC film/ $SiO_2$ film/SiC film is formed. In the inter-layer insulating film 78, as in the inter-layer insulating film 24, interconnection layers 80a, dummy patterns 80b and a ring pattern 80c are buried. On the inter-layer insulating film 78, an inter-layer insulating film 82 of the same layer structure as the inter-layer insulating film 78 is formed. In the inter-layer insulating film 82, as in the inter-layer insulating film 24, interconnection layers 84a, dummy patterns 84b and a ring pattern 84c are buried.

On the inter-layer insulating film 82, an inter-layer insulating film 86 of a layer structure of $SiO_2$ film/Sic film is formed. In the inter-layer insulating film 86, a contact plug 88 is buried. A ring pattern 90c is formed on the inter-layer insulating film 86, connected to the contact plug 88. On the inter-layer insulating film 86 with the ring pattern 90c formed on, a cover film 92 of a layer structure of SiN film/$SiO_2$ film is formed.

The guard ring region is an annular region enclosing the internal circuit region, and the guard ring 2 is formed in this region. In the semiconductor device according to the present embodiment, the guard ring 2 is formed of the layer structure of the contact plug 22, the ring patterns 38c, 42c, 46c, 50c, 64c, 68c, 72c, 76c, 80c, 84c, the contact plug 88 and the ring pattern 90c which are formed, connected thickness-wise in the guard ring region.

The dummy pattern region is a region where the dummy patterns are formed for decreasing intra-plane variations of a polishing amount, e.g., dishing due to overpolishing of copper or erosion due to overpolishing of the inter-layer insulating films in the CMP for forming the interconnection layers by dual damascene process. In the dummy pattern region, the dummy patterns of the respective layers are formed of the same conducting layers as their associated interconnection layers are arranged so that a pattern density is uniform in wafer plane. In the dummy region, as exemplified in FIG. 2, the dummy patterns 7 are periodically formed in a rectangular shape.

Here, the semiconductor device according to the present embodiment is characterized in that the dummy patterns adjacent in film thickness-wise are connected with each other, whereby the mechanical strength, especially the film thickness-wise strength of the inter-layer insulating films around the interconnected dummy patterns is increased. Thus, the generation of cracks and peelings in the inter-layer insulating films due to stresses generated in the interfaces between the inter-layer insulating films or in the inter-layer insulating films can be prevented.

According to the studies made by the inventors of the present application, the dummy patterns disposed at an about 10 μm-distance from the guard ring are interconnected with each other through the via portions, whereby the generation of cracks during processing, cracks in assembling (wire bonding or connecting bumps) and extension of the cracks in blowing fuses by laser could be suppressed.

Then, the method for fabricating the semiconductor device according to the present embodiment will be explained with reference to FIGS. 4A to 9C.

Figure 4A:
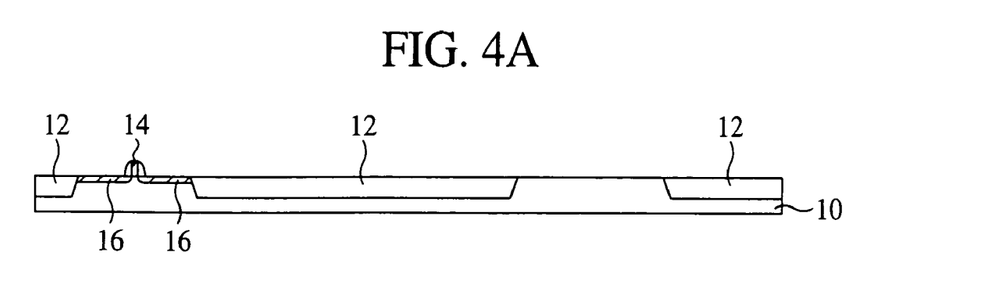
FIGS. 4A–4D, 5A–5D, 6A–6D, 7A–7D, 8A–8D, and 9A–9C are sectional views of the semiconductor device according to the first embodiment of the present invention in the steps of the method for fabricating the same, which show the method.

First, the device isolation film 12 for defining device regions is formed on a silicon substrate 10 by, e.g., STI (Shallow Trench Isolation) method.

Then, on the silicon substrate 10 with the device isolation film 12 formed on, MOS transistors each including a gate electrode 14 and source/drain diffused layers 16 are formed in the same way as in the usual MOS transistor forming method (FIG. 4A).

Figure 4B:
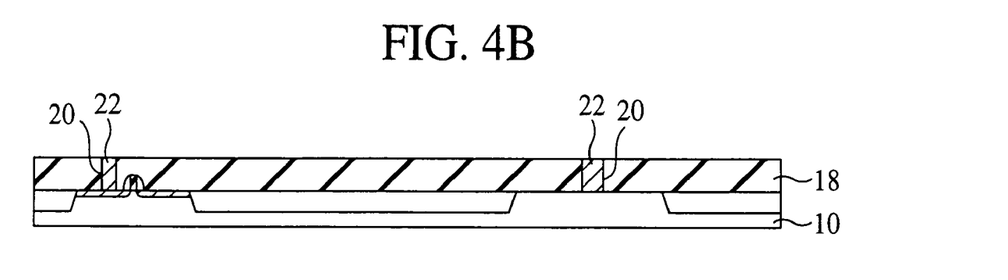

Then, on the silicon substrate 10 with the MOS transistors formed on, a silicon oxide film of, e.g., a 700 nm-thick is formed by, e.g., CVD (chemical vapor deposition) method to form the inter-layer insulating film 18 of the silicon oxide film.

Then, the surface of the inter-layer insulating film 18 is polished by, e.g., CMP method to make the surface of the inter-layer insulating film 18 flat.

Next, contact holes are formed in the inter-layer insulating film 18 down to the silicon substrate 10. The contact hole 20 formed in the guard ring region has a ring-shaped groove pattern inclosing the internal circuit region.

Next, a Ti (titanium) film of, e.g., a 15 nm-thick, a TiN (titanium nitride) film of, e.g., a 10 nm-thick and a W (tungsten) film of, e.g., a 250 nm-thick are formed by, e.g., CVD method.

Then, the W film, the TiN film and the Ti film are removed flat by CMP method until the surface of the inter-layer insulating film 18 is exposed to form contact plugs 22 buried in contact holes 20 and formed of the Ti film, the TiN film and the W film (FIG. 4B).

Figure 4C:
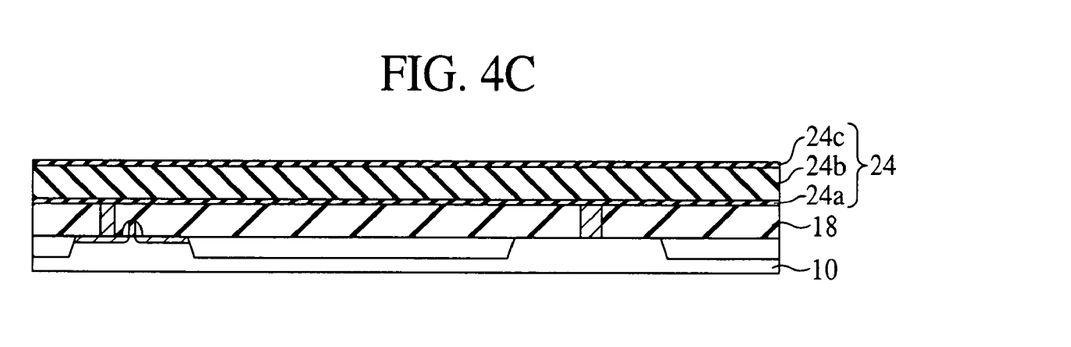

Next, an SiC film 24a of, e.g., a 30 nm-thick is deposited by, e.g., CVD method on the inter-layer insulating film 18 with the contact plugs 22 buried in.

Next, a SiLK film 24b of, e.g., a 450 nm-thick is formed on the SiC film 24a by, e.g., spin coating method.

Then, an SiC film 24c of, e.g., a 30 nm-thick is formed on the SILK film 24b by, e.g., CVD method.

Thus, the inter-layer insulating film 24 of the layer structure of the SiC film 24c/the SiLK film 24b/the SiC film 24a is formed (FIG. 4C). The SiC films 24a, 24c function as an etching stopper film and a diffusion preventing film for copper.

Figure 4D:
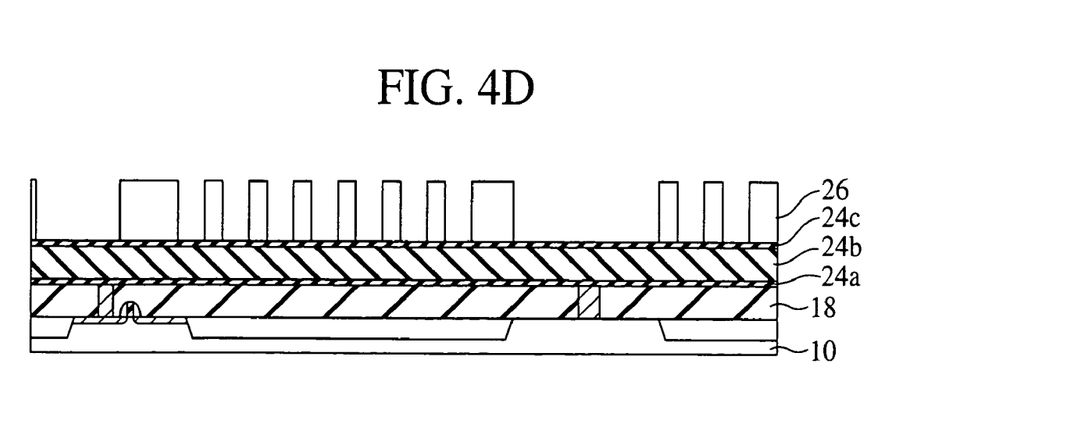

Then, on the inter-layer insulating film 24, a photoresist film 26 exposing the regions for the interconnection layers, the dummy patterns and the ring pattern to be formed in is formed by photolithography (FIG. 4D).

Figure 5A:
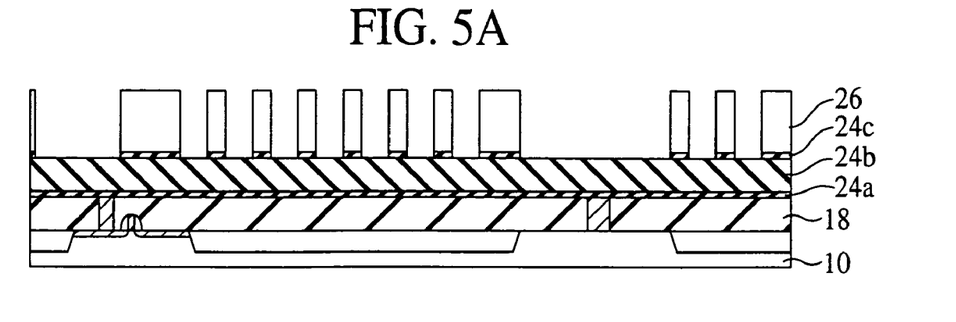

Then, with the photoresist film 26 as a mask, the SiC film 24c is anisotropically etched (FIG. 5A).

Figure 5B:
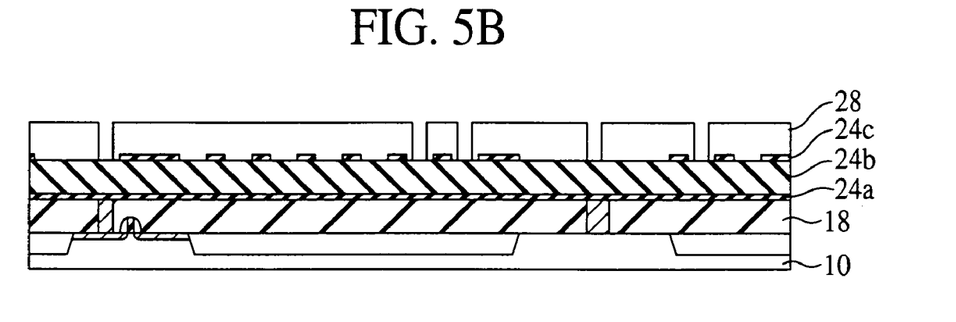

Then, after the photoresist film 26 has been removed, a photoresist film 28 exposing regions for the via holes to be formed in is formed by photolithography. The photoresist film 28 exposes, in the dummy pattern region, regions for via holes-to-be-formed-in for interconnecting the dummy patterns near the guard ring region in film thickness-wise, exposes, in the guard ring region, a region for the groove-shaped via hole-to-be-formed-in for connecting the ring pattern with the contact plug 22 (FIG. 5B).

Figure 5C:
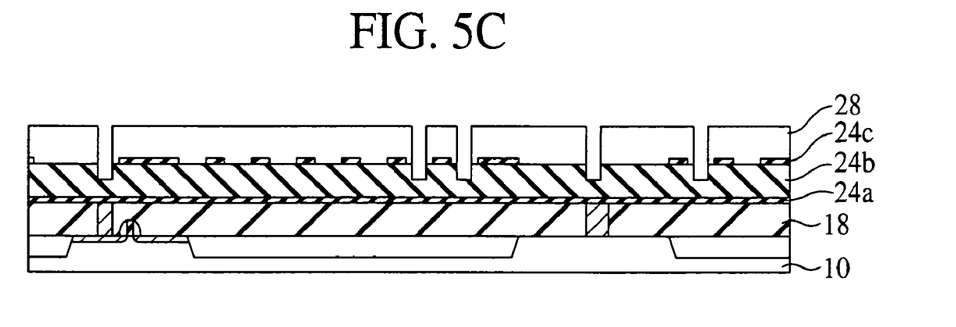

Next, with the photoresist film 28 as a mask, the SiLK film 28b is etched. This etching has the etching time controlled so that the etching is stopped near the center of the SILK film 28b (FIG. 5C).

Figure 5D:
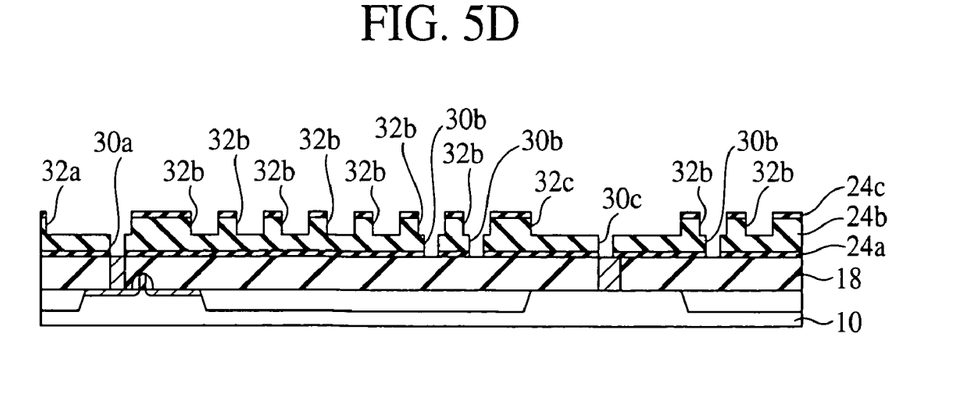

Then, after the photoresist film 28 has been removed, with the SiC film 24c as a mask, the SiLK film 24b and the SiC film 24a are etched to form in the inter-layer insulating film 24 via holes 30a for the via portions of the interconnection layers to be buried in and interconnection grooves 32a, via holes 30b and grooves 32b for the dummy patterns to be buried in, and a via hole 30c and a groove 32c for the ring pattern to be buried in (FIG. 5D).

Figure 6A:
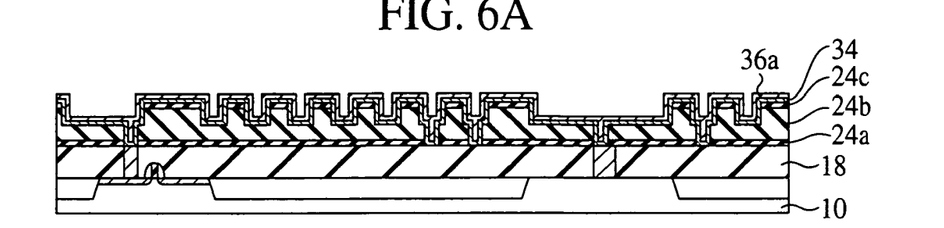

Next, a barrier metal 34 of a TaN (tantalum nitride) film of, e.g., a 20 nm-thick, and a Cu (copper) film 36a of, e.g., a 80 nm-thick are deposited by, e.g., sputtering method (FIG. 6A).

Figure 6B:
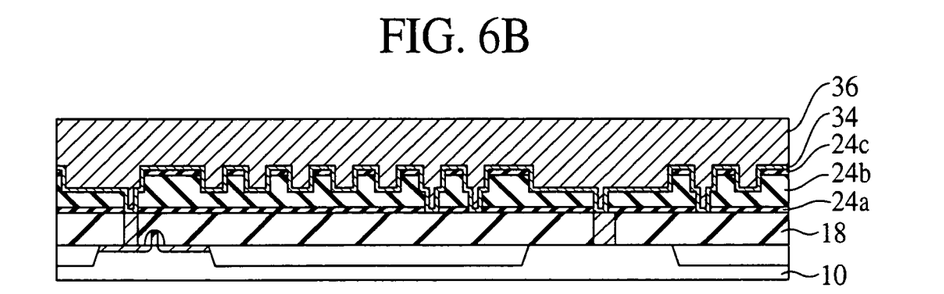

Then, with the Cu film 36 as a seed, a Cu film is further deposited on the Cu film 36a by electrolytic plating to form a Cu film 36 of a 900 nm-total thickness (FIG. 6B).

Figure 6C:
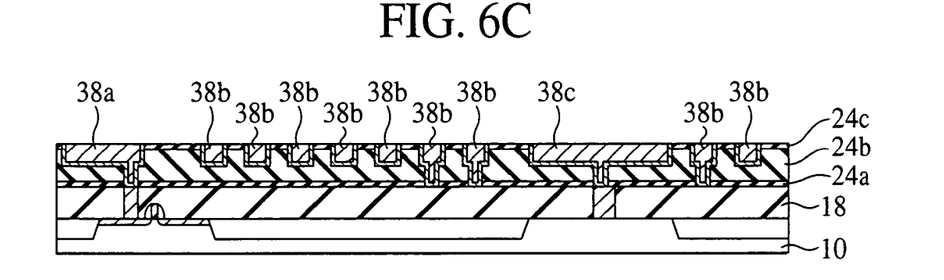

Next, the Cu film 36 and the barrier metal 34 are removed flat by CMP method until the surface of the inter-layer insulating film 24 is exposed to form the interconnection layer 38a buried in the via holes 30a and the interconnection grooves 32a, the dummy patterns 38b buried in the via holes 30b and the grooves 32b, and the ring pattern 38c buried in the via hole 30c and the groove 32c (FIG. 6C).

Figure 6D:
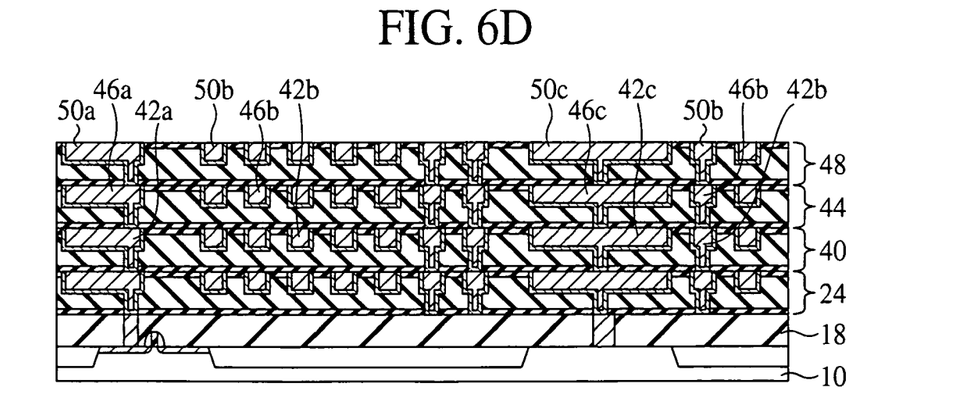

Next, the steps exemplified in FIG. 4C to FIG. 6C are repeated to form the interconnection layers 42a, the dummy patterns 42b and the ring pattern 42c buried in the inter-layer insulating film 40, the interconnection layers 46a, the dummy patterns 46b and the ring pattern 46c buried in the inter-layer insulating film 44, and the interconnection layers 50a, the dummy patterns 50b and the ring pattern 50c buried in the inter-layer insulating film 48 (FIG. 6D).

At this time, the dummy patterns near the ring pattern are connected to the dummy patterns in the lower layer through the via holes. Thus, the film thickness-wise mechanical strength between the dummy patterns is increased, whereby the generation of cracks and peelings in the inter-layer insulating films near the ring pattern due to mechanical stresses in the CMP processing can be prevented.

Figure 7A:
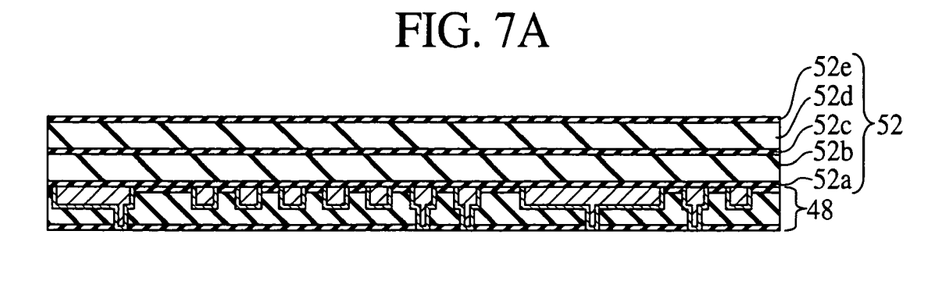

Next, an SiC film 52a of, e.g., a 50 nm-thick, an SiOC film 52b of, e.g., a 500 nm-thick, an SiC film 52c of, e.g., a 50 nm-thick, an SiOC film 52d of, e.g., a 400 nm-thick, and an SiC film 52e of, e.g., a 50 nm-thick are sequentially deposited on the inter-layer insulating film 48, by, e.g., CVD method to form the inter-layer insulating film 52 of the layer structure of the SiC film 52e/the SiOC film 52d/the SiC film 52c/the SiOC film 52b/the SiC film 52a (FIG. 7A). The SiC films 52a, 52c, 52e function as an etching stopper film and a diffusion preventing film for copper.

In FIG. 7A and the followers, the structure below the inter-layer insulating film 44 is omitted.

Figure 7B:
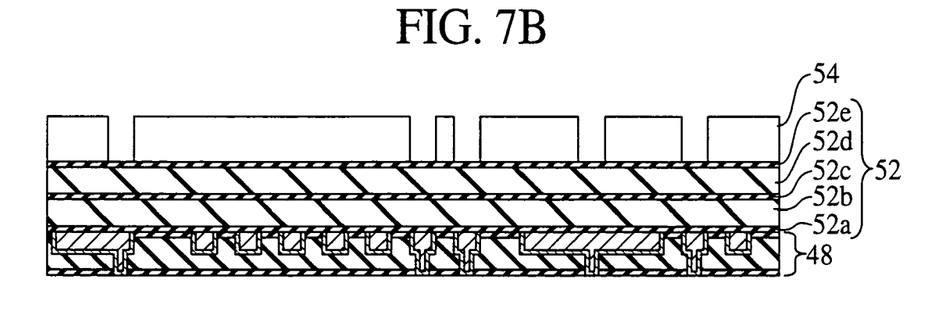

Then, a photoresist film 54 exposing the regions for the via holes to be formed in is formed by photolithography. The photoresist film 54 exposes, in the dummy pattern region, regions for via holes-to-be-formed-in for interconnecting the dummy patterns near the guard ring region in film thickness-wise, and exposes, in the guard ring region, a region for a groove-shaped via hole-to-be-formed-in for connecting the ring pattern to the ring pattern 50c (FIG. 7B).

Figure 7C:
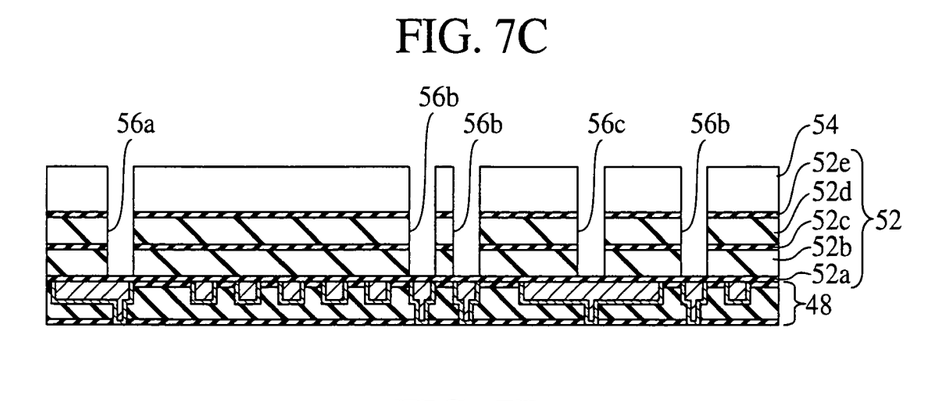

Then, with the photoresist film 54 as a mask, the SiC film 52e, the SiOC film 52d, the SiC film 52c and the SiOC film 52b are etched to open via holes 56a for interconnecting the interconnection layers, via holes 56b for interconnecting the dummy patterns, and a groove-shaped via hole 56c for interconnecting the ring patterns are opened down on the SiC film 52a (FIG. 7C).

Next, the photoresist film 54 is removed.

Figure 7D:
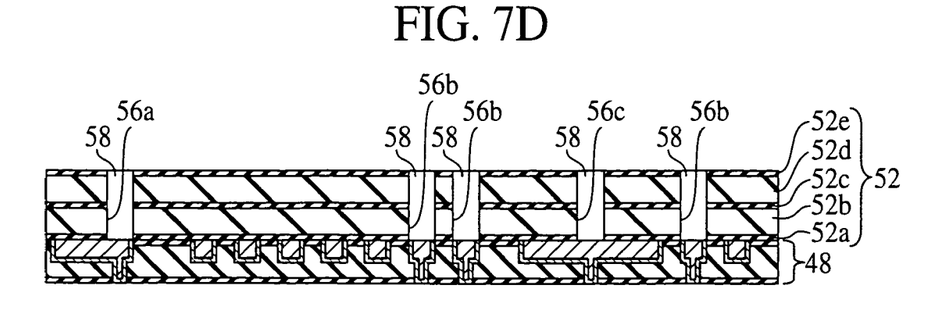

Then, a photoinsensitive resin 58 is applied by, e.g., spin coating method, and then the photoinsensitive resin 58 on the inter-layer insulating film 52 is dissolved off, partially left in the via holes 56a, 56b, 56c (FIG. 7D). The photoinsensitive resin 58 functions as a protection film for the vias in a later step.

Figure 8A:
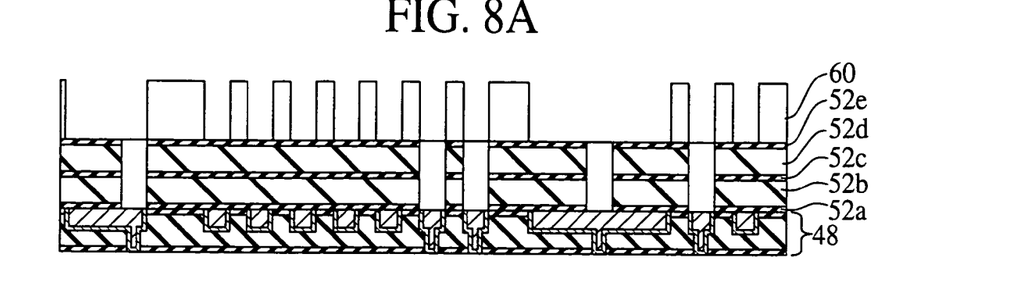

Then, a photoresist film 60 exposing regions for interconnection layers, dummy patterns and the ring pattern to be formed in is formed by photolithography on the inter-layer insulating film 52 with the photoinsensitive resin 58 buried in (FIG. 8A).

Figure 8B:
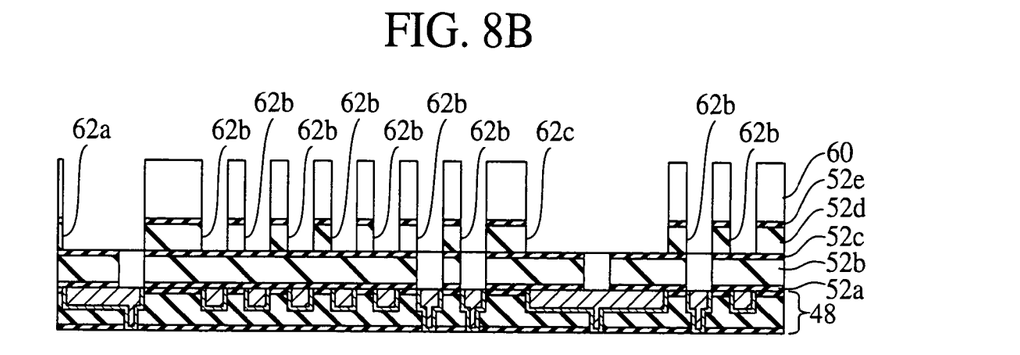
Figure 8C:
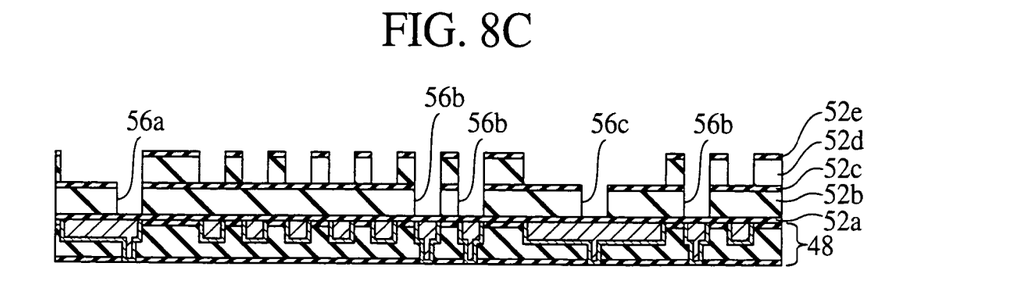

Then, with the photoresist film 60 as a mask and the SiC film 52c as a stopper, the SiC film 52e and the SiOC film 52d are anisotropically etched to form in the SiOC film 52d and the SiC film 52e interconnection grooves 62a for the interconnection layers to be buried in, grooves 62b for the dummy patterns to be buried in and a groove 62c for the ring pattern to be buried in (FIG. 8B).

Figure 8D:
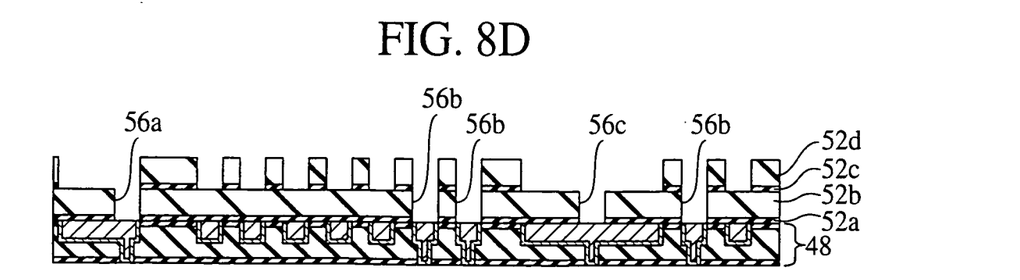

Next, after the photoinsensitive region 58 has been removed together with the photoresist film 60 (FIG. 8C), the SiC films 52a, 52c, 52e are anisotropically etched to remove the SiC film 52e and open via holes 56a down onto the interconnection layers 50a, via holes 56b down onto the dummy patterns 50b, a via hole 56c down onto the ring pattern 50c, and interconnection grooves 62a and grooves 62b, 62c down onto the SiOC film 52b (FIG. 8D).

Figure 9A:
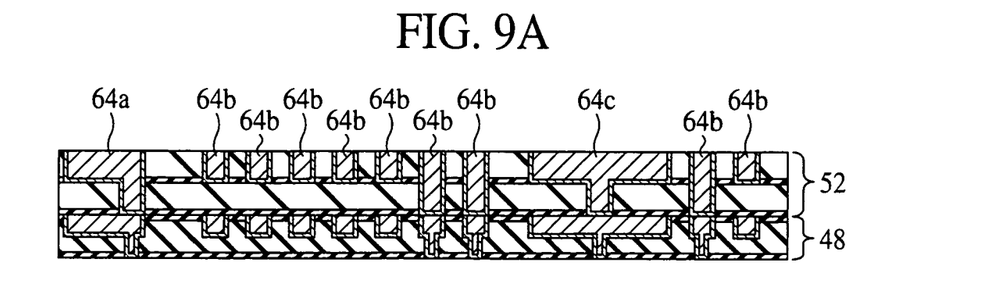

Next, in the same way as shown in, e.g., FIGS. 6A to 6C, the interconnection layers 64a buried in the via holes 56a and the interconnection grooves 62a, the dummy patterns 64b buried in the via holes 56b and the grooves 62b, and ring pattern 64c buried in the via hole 56c and the groove 62c are formed (FIG. 9A).

At this time, the dummy patterns near the ring pattern are connected to the dummy patterns in the lower layer through the via holes. Thus, the film thickness-wise mechanical strength between the dummy patterns is increased, whereby the generation of cracks and peelings in the inter-layer insulating film near the ring pattern due to mechanical stresses in the CMP processing can be prevented.

Figure 9B:
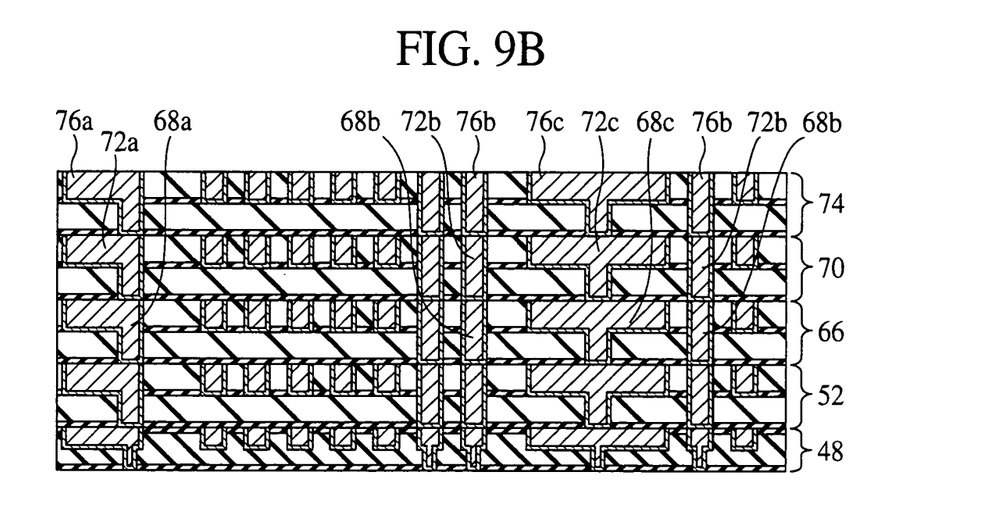

Next, the steps exemplified in FIG. 7A to FIG. 9A are repeated to form the interconnection layers 68a, the dummy patterns 68b and the ring pattern 68c buried in the inter-layer insulating film 66, the interconnection layers 72a, the dummy patterns 72b and the ring pattern 72c buried in the inter-layer insulating film 70, the interconnection layers 76a, the dummy patterns 76b and the ring pattern 76c buried in the inter-layer insulating film 74 (FIG. 9B).

Then, the steps exemplified in FIGS. 7A to 9A are repeated, using SiO film in place of the SiOC film to form the interconnection layers 80a, the dummy patterns 80b and the ring pattern 80c buried in the inter-layer insulating film 78, the interconnection layers 84a, the dummy patterns 84b and the ring pattern 84c buried in the inter-layer insulating film 82.

Next, on the inter-layer insulating film 82, an SiC film 86a of, e.g., a 50 nm-thick and an SiO film 86b of, e.g., a 500 nm-thick are deposited to form the inter-layer insulating film 86 of the layer structure of the SiO film/the SiC film.

Then, in the same way as shown in, e.g., FIG. 4B, the contact plug 88 buried in the inter-layer insulating film 86 is formed.

Next, a TiN film of, e.g., a 100 nm-thick, an Al (aluminum) film of, e.g., a 900 nm-thick and a TiN film of, e.g., a 50 nm-thick are deposited by, e.g., sputtering method on the inter-layer insulating film 88 with the contact plug 88 buried in.

Next, by photolithography and dry etching, the layer structure of the TiN film/the Al film/the TiN film is patterned to form interconnection layers (not shown), pads (not shown), the ring pattern 90c, etc.

Figure 9C:
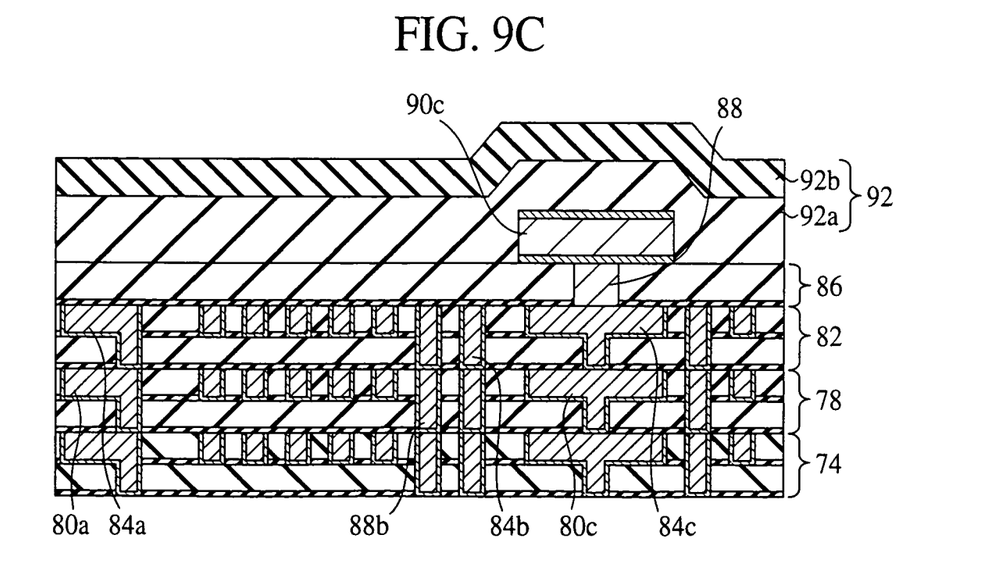

Next, on the inter-layer insulating film 88 with the ring pattern 90c, etc. formed on, an SiO film 92a of, e.g., a 1200 nm-thick and an SiN film of, e.g., a 400 nm-thick are formed by, e.g., CVD method to form a cover film of the layer structure of the SiN film/the SiO film (FIG. 9C).

As described above, according to the present embodiment, the dummy patterns near the guard ring are interconnected in film thickness-wise, whereby the inter-layer insulating films near the interconnected dummy patterns can be reinforced. Thus, the generation of cracks and peelings in the interfaces between the inter-layer insulating films or in the inter-layer insulating films due to mechanical or thermal stresses can be prevented.

A Second Embodiment

The semiconductor device and the method for fabricating the same according to a second embodiment of the present invention will be explained with reference to FIGS. 10A and 10B. The same members of the present embodiment as those of the semiconductor device and the method for fabricating the same according to the first embodiment shown in FIGS. 1 to 9C are represented by the same reference numbers not to repeat or to simplify their explanation.

Figure 10A:
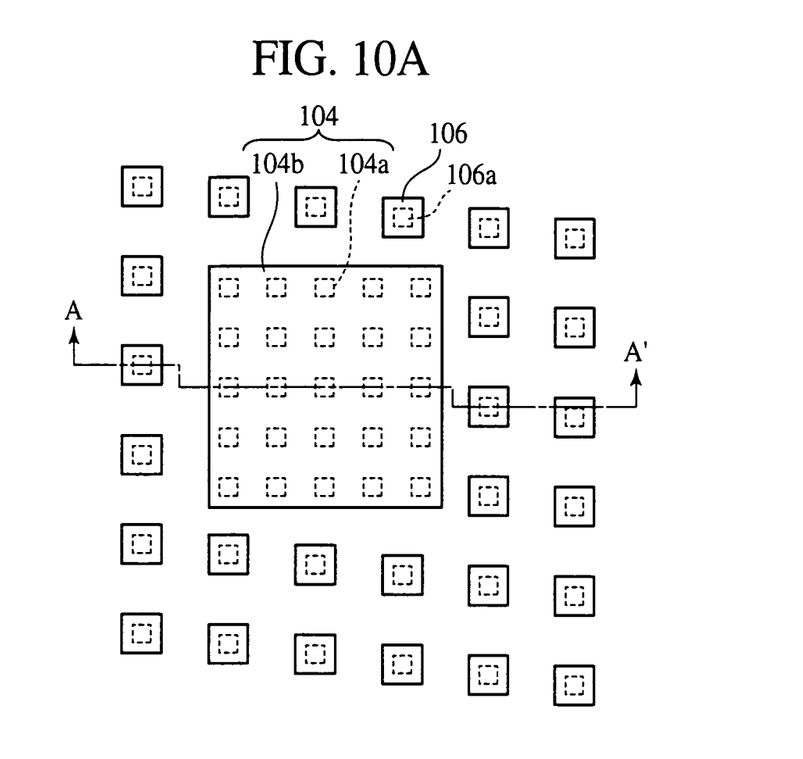
FIG. 10A is a plan view of the semiconductor device according to a second embodiment of the present invention, which show a structure thereof.

FIG. 10A is a plan view of the semiconductor device according to the present embodiment, which show a structure thereof. FIG. 10B is a sectional view of the semiconductor device according to the present embodiment, which show a structure thereof.

Figure 10B:
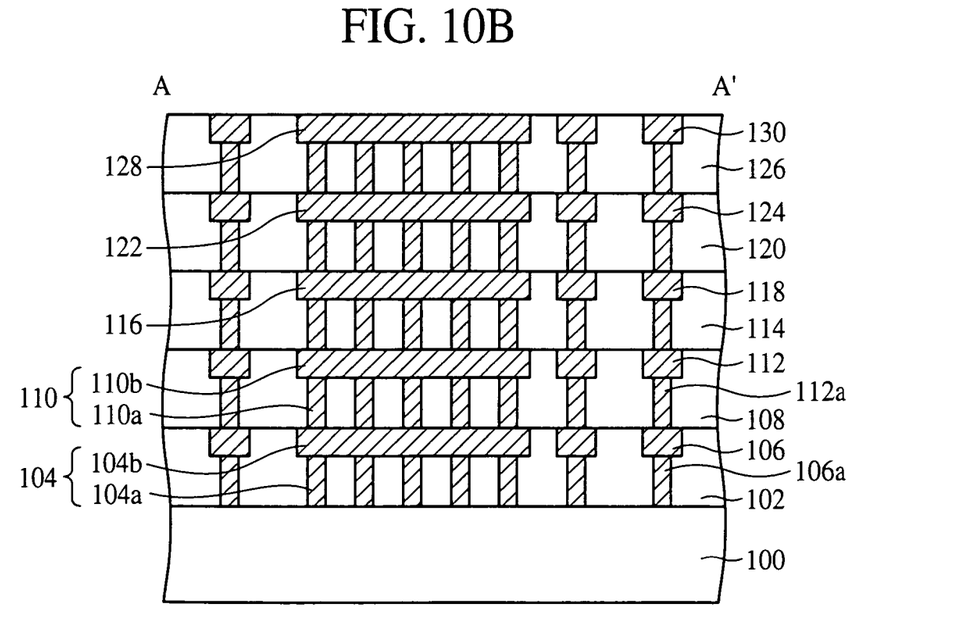
FIG. 10B is a diagrammatic sectional view of the semiconductor device according to the second embodiment of the present invention, which show a structure thereof.

As shown in FIG. 10B, an inter-layer insulating film 102 is formed on a substrate 100. An interconnection layer 104 and dummy patterns 106 are buried in the inter-layer insulating film 102. The interconnection layer 104 has plural via portions 104a and an interconnection portion 104b formed on the via portions 104a. Via portions 106a are provided in the dummy patterns 106 near the interconnection layer 104.

As shown in FIG. 10A, the dummy patterns 106 are periodically disposed around the pads. The dummy patterns are for decreasing intra-plane variations of a polishing amount, e.g., dishing due to overpolishing of copper or erosion due to overpolishing of the inter-layer insulating films in the CMP for forming the interconnection layer by dual damascene process.

On the inter-layer insulating film 102, an inter-layer insulating film 108 with an interconnection layer 110 and dummy patterns 112 buried in is formed. The interconnection layer 110 has plural via portions 110a, and an interconnection portion 110b formed on the via portions 110a and is connected to the interconnection layer 104 through the via portions 110a. The dummy patterns 112 near the interconnection layer 110 have via portions 112a to be connected to the dummy patterns 106 through the via portions 112a.

In the same way as described above, on the inter-layer insulating film 108, an inter-layer insulating film 114 with an interconnection layer 116 and the dummy patterns 118 buried in, an inter-layer insulating film 120 with an interconnection layer 122 and the dummy patterns 124 buried in, and an inter-layer insulating film 126 with an interconnection layer 128 and the dummy patterns 130 buried in are formed.

A pad structure formed of the interconnection layers 104, 110, 116, 122, 128 interconnected with each other in thickness-wise through the via portions is thus formed. The dummy patterns 106, 112, 118, 124, 130 are interconnected with each other in thickness-wise through the via portions.

As shown in FIG. 10B, pads for electrically connecting semiconductor chips with outside circuits are often formed by stacking a plurality of interconnection layers, as are the guard rings. The pads have larger areas in comparison with the usual interconnection patterns, and due to mechanical stresses which are applied to the pads in wire bonding and bump forming, the pads often cause cracks and peelings in inter-layer insulating films near the pads due to mechanical stresses or thermal stresses.

As in the semiconductor device according to the first embodiment, the via portions are provided in the dummy patterns near the pads, and the dummy patterns are interconnected with each other in thickness-wise as shown in FIG. 10B, whereby the inter-layer insulating film near the interconnected dummy patterns can be reinforced. Thus, the generation of cracks and peelings in the interfaces between the inter-layer insulating films or in the inter-layer insulating films due to mechanical or thermal stresses can be prevented.

As described above, according to the present embodiment, the dummy patterns near the pad structures are interconnected with each other in thickness-wise, whereby the inter-layer insulating films near the interconnected dummy patterns can be reinforced. Thus, the generation of cracks and peelings in the interfaces between the inter-layer insulating films or the inter-layer insulating films due to mechanical stresses exerted in wire bonding to the pads and forming bumps on the pads and thermal stresses in fabrication process can be prevented.

In the present embodiment, for the convenience of the description, the structures of the inter-layer insulating films, the interconnection layers and the dummy patterns are simplified, but their structures can be the same as their structures of the semiconductor device according to the first embodiment.

A Third Embodiment

The semiconductor device and the method for fabricating the same according to a third embodiment of the present invention will be explained with reference to FIGS. 11A and 11B. The same members of the present embodiment as those of the semiconductor device and the method for fabricating the same according to the first and the second embodiments shown in FIGS. 1 to 10B are represented by the same reference numbers not to repeat or to simplify their explanation.

Figure 11A:
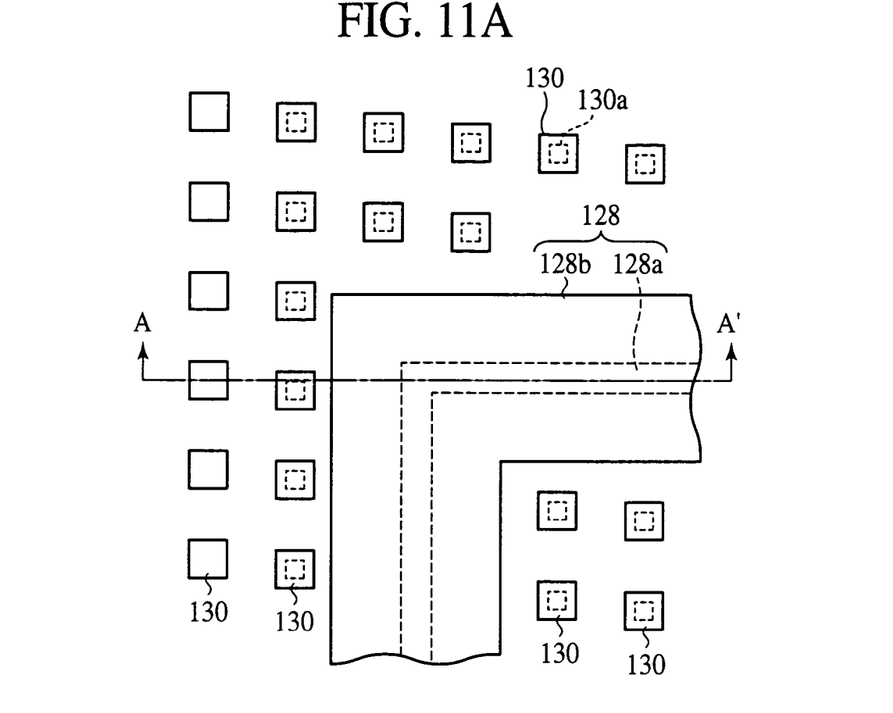
FIG. 11A is a plan view of the semiconductor device according to a third embodiment of the present invention, which show a structure thereof.

FIG. 11A is a plan view of the semiconductor device according to the present embodiment, which shows a structure thereof. FIG. 11B is a sectional view of the semiconductor device according to the present embodiment, which shows a structure thereof.

Figure 11B:
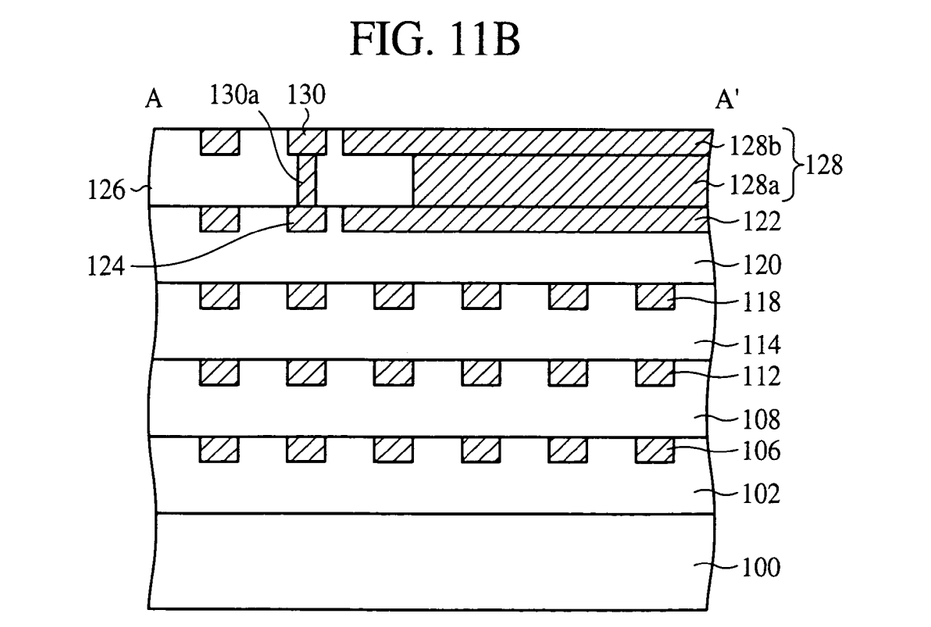
FIG. 11B is a diagrammatic sectional view of the semiconductor device according to the third embodiment of the present invention, which show a structure thereof.

As shown in FIG. 11B, an inter-layer insulating film 102 with dummy patterns 106 buried in, an inter-layer insulating film 108 with dummy patterns 112 buried in and an inter-layer insulating film 114 with dummy patterns 118 buried in are formed sequentially on a substrate 100.

On the inter-layer insulating film 114, an inter-layer insulating film 120 with an interconnection layer 122 and dummy patterns 124 buried in, and an inter-layer insulating film 126 with an interconnection layer 128 and dummy patterns 130 buried in are formed. The interconnection layer 128 has a via portion 128a and interconnection portion 128b formed on the via portion 128a, and is connected to the interconnection layer 122 through the via portions 128a. The dummy patterns 130 near the interconnection layer 128 have via portions 130a, and are connected to the dummy patterns 124 through the via portions 130a.

Thus, an interconnection structure is formed of the interconnection layers 122, 128 interconnected with each other in thickness-wise through the via portion 128b. Such interconnection structure is used in, e.g., a spiral inductor which is in the shape of a coil in a single plane. In such inductor, plural interconnection layers are connected through vias to thereby decrease the interconnection resistance.

As shown in FIG. 11A, in the spiral inductor as well as the guard ring, which has the structure of stacked acutely bent interconnections, cracks and peelings often take place in the inter-layer insulating films near the pattern corners due to mechanical stresses and thermal stresses.

As in the semiconductor device according to the first embodiment, the via portions are provided in the dummy patterns disposed near the interconnection layer, and the dummy patterns are interconnected in thickness-wise through the via portions as shown in FIG. 11B, whereby the inter-layer insulating films near the interconnected dummy patterns can be reinforced. Thus, the generation of cracks and peelings in the interfaces between the inter-layer insulating films or in the inter-layer insulating films due to mechanical stresses or thermal stresses can be prevented.

As described above, according to the present embodiment, the dummy patterns near the inductor are interconnected with each other in thickness-wise, whereby the inter-layer insulating films near the interconnected dummy patterns can be reinforced. Thus, the generation of cracks and peelings in the interfaces between the inter-layer insulating films and in the inter-layer insulating films due to mechanical stresses and thermal stresses can be prevented.

In the present embodiment, for the convenience of the description, the structures of the inter-layer insulating films, the interconnection layers and the dummy patterns are simplified, but their structures can have the same structures as those of the semiconductor device according to the first embodiment.

Modified Embodiments

The present invention is not limited to the above-described embodiments and can cover other various modifications.

For example, in the first embodiment described above, the dummy patterns 38b formed of the first copper interconnection layer up to the dummy patterns 84b formed of the tenth copper interconnection layer are all interconnected in thickness-wise, but all the dummy patterns of all the layers are not essentially interconnected with each other.

For example, in the semiconductor device according to the first embodiment, only the dummy patterns near the interface between the inter-layer insulating film 48 and the inter-layer insulating film 52 may be interconnected with each other. In the semiconductor device according to the first embodiment, between the fourth copper interconnection layer and the fifth copper interconnection layer, the inter-layer insulating film mainly formed of SiLK film is replaced by the inter-layer insulating film mainly formed of SiOC film. Films of polyallyl ether resins, such as SiLK, FLARE, etc. and films of organosilicate glass, such as SiOC, $SiO_2$, etc. are much different from each other in thermal expansion coefficient, and the inter-layer insulating films near this interface will be vulnerable to thermal stresses. Accordingly, the interconnections of only the dummy patterns near the interface between the inter-layer insulating film 48 and the inter-layer insulating film 52 could sufficiently effectively prevent cracks and peelings in the interfaces between the inter-layer insulating films and in the inter-layer insulating films.

In the first embodiment, only the dummy patterns near the guard ring are interconnected with each other in thickness-wise, but all the dummy patterns may be interconnected with each other in thickness-wise. Only the dummy patterns near the corners of the patterns, which are vulnerable to the stresses, may be interconnected in thickness-wise.

In the third embodiment, only the dummy patterns which are formed of the same conducting layer as the interconnection layers connected with each other through the via portions are interconnected with each other in thickness-wise, but even the dummy patterns of further lower layers or further upper layers may be interconnected.

In the above-described embodiments, the dummy patterns are formed for decreasing intra-plane variations of a polishing amount, e.g., dishing due to overpolishing of copper or erosion due to overpolishing of the inter-layer insulating films in the CMP for forming the interconnection layer by dual damascene process, but the dummy patterns are not essentially formed for this end.

In the first to the third embodiments, the dummy patterns formed in the respective layers are all formed in the same pattern but may not be essentially all formed in the same pattern. Preferably, a pattern layout of each layer is decided suitably for the purpose of the dummy patterns.

When dummy patterns are formed near a structure which induces cracks and peelings in the interfaces between the inter-layer insulating films or in the inter-layer insulating films are formed, the dummy patterns may be interconnected in thickness-wise. When no dummy patterns are formed, new dummy patterns are provided, and the dummy patterns may be interconnected in thickness-wise.

In the above-described embodiment, interconnection structures which may induce cracks and peelings in the interfaces between the inter-layer insulating films and in the inter-layer insulating films are exemplified by guard rings, pads, inductors. However, in structures other than these structures, the present invention will be effective.

What is claimed is:

1. A semiconductor device comprising:
   a first insulating film formed over a semiconductor substrate;
   a second insulating film formed over the first insulating film;
   an interconnection structure buried in the first insulating film and in the second insulating film;
   a plurality of first dummy patterns formed from a first conducting layer buried in at least a surface side of the first insulating film near the interconnection structure; and
   a plurality of second dummy patterns formed from a second conducting layer buried in the second insulating film and connected to the plurality of first dummy patterns through via portions, the plurality of second dummy patterns being adjacent to each other and disposed at even intervals so as to make a pattern density of elements formed from the second conducting layer substantially uniform in plane.

2. A semiconductor device according to claim 1, wherein the interconnection structure includes a first interconnection pattern buried in the first insulating film and formed from the first conducting layer, and a second interconnection pattern buried in the second insulating film, formed from the second conducting layer and connected to the first interconnection pattern through a via portion.

3. A semiconductor device according to claim 2, wherein the via portion through which the second interconnection pattern is connected to the first interconnection pattern has a groove-shaped pattern.

4. A semiconductor device according to claim 1, wherein part of the plurality of second dummy patterns arranged near the interconnection structure are connected to the first dummy patterns via the via portion.

5. A semiconductor device according to claim 1, wherein the plurality of first dummy patterns are adjacent to each other and disposed at even intervals so as to make a pattern density of elements formed from the first conducting layer substantially uniform in plane.

6. A semiconductor device according to claim 1, wherein the first conducting layer and the second conducting layer are formed of a conducting material mainly based on copper.

7. A semiconductor device according to claim 1, wherein the first insulating film and the second insulating film are formed of films based mainly on different insulating materials with each other.

8. A semiconductor device according to claim 7, wherein the first insulating film is mainly formed of a polyallyl ether resin film, and
the second insulating film is mainly formed of a organo-silicate glass film.

9. A semiconductor device according to claim 1, wherein the interconnection structure is a guard ring, an inductor or a pad.

* * * * *